US011171612B2

(12) United States Patent
Yang et al.

(10) Patent No.: US 11,171,612 B2
(45) Date of Patent: Nov. 9, 2021

(54) GAIN MODULATION CIRCUIT

(71) Applicant: Realtek Semiconductor Corporation, Hsinchu (TW)

(72) Inventors: Jun Yang, Jiangsu Province (CN); Wei-Xiong He, Jiangsu Province (CN); Jian Liu, Jiangsu Province (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 71 days.

(21) Appl. No.: 16/782,266

(22) Filed: Feb. 5, 2020

(65) Prior Publication Data

US 2021/0044258 A1 Feb. 11, 2021

(30) Foreign Application Priority Data

Aug. 6, 2019 (CN) .......................... 201910722309.4

(51) Int. Cl.
 *H03F 3/45* (2006.01)
 *H03F 1/32* (2006.01)
 *H03G 3/30* (2006.01)

(52) U.S. Cl.
 CPC ......... *H03F 1/3211* (2013.01); *H03F 1/3205* (2013.01); *H03F 3/45179* (2013.01); *H03G 3/30* (2013.01); *H03F 2201/3215* (2013.01)

(58) Field of Classification Search
 CPC .......... H03F 3/45; H03F 3/45179; H03G 3/30

USPC ................................................ 330/254, 304
See application file for complete search history.

(56) References Cited

U.S. PATENT DOCUMENTS

| 5,384,501 A | * | 1/1995 | Koyama | ................. G06G 7/184 327/336 |
| 2009/0072904 A1 | * | 3/2009 | Bae | ..................... H03F 3/45098 330/254 |
| 2010/0315164 A1 | | 12/2010 | Vakilian | |
| 2019/0052236 A1 | | 2/2019 | Sugimoto et al. | |

* cited by examiner

*Primary Examiner* — Steven J Mottola
(74) *Attorney, Agent, or Firm* — Locke Lord LLP; Tim Tingkang Xia, Esq.

(57) ABSTRACT

A gain modulation circuit includes a load circuit, a differential circuit, a current source, a resistor, a first transistor, and a detector circuit. The load circuit is configured to receive a supply voltage. The differential circuit is coupled to the load circuit. The differential circuit and the load circuit are configured to generate a pair of output voltages according to a pair of input voltages and the supply voltage. The current source is coupled to the differential circuit. The resistor is coupled to the differential circuit and the current source. The first transistor is coupled to the differential circuit. The detector circuit is configured to generate a detection signal according to the pair of input voltages. A turned-on degree of the first transistor is adjusted based on the detection signal, to adjust a linear region of the gain modulation circuit.

20 Claims, 8 Drawing Sheets

GAIN MODULATION CIRCUIT

RELATED APPLICATIONS

This application claims priority to Chinese Application Serial Number 201910722309.4, filed Aug. 6, 2019, which is herein incorporated by reference.

BACKGROUND

Technical Field

The present disclosure relates to a circuit technology. More particularly, the present disclosure relates to a gain modulation circuit, and a linear region of the gain modulation circuit is adjustable.

Description of Related Art

With development in the circuit technology, various integrated circuits (ICs) are developed. A linearity of an integrated circuit is better if an output voltage of the integrated circuit is proportional to an input voltage of the integrated circuit. The linearity is a key factor for efficiency of the integrated circuit.

SUMMARY

One embodiment of the present disclosure is related to a gain modulation circuit. The gain modulation circuit includes a load circuit, a differential circuit, a current source, a resistor, a first transistor, and a detector circuit. The load circuit is configured to receive a supply voltage. The differential circuit is coupled to the load circuit. The differential circuit and the load circuit are configured to generate a pair of output voltages according to a pair of input voltages and the supply voltage. The current source is coupled to the differential circuit. The resistor is coupled to the differential circuit and the current source. The first transistor is coupled to the differential circuit. The detector circuit is configured to generate a detection signal according to the pair of input voltages. A turned-on degree of the first transistor is adjusted based on the detection signal, to adjust a linear region of the gain modulation circuit.

One embodiment of the present disclosure is related to a gain modulation circuit. The gain modulation circuit includes a load circuit, a differential circuit, a current source, a resistor, and a detector circuit. The load circuit is configured to receive a supply voltage. The differential circuit is coupled to the load circuit. The differential circuit and the load circuit are configured to generate a pair of output voltages according to a pair of input voltages and the supply voltage. The current source is coupled to the differential circuit. The resistor is coupled to the differential circuit and the current source. The detector circuit is configured to generate a detection signal according to the pair of input voltages. The detection signal is configured to control a gain of the gain modulation circuit, to adjust a linear region of the gain modulation circuit.

As the above embodiments, the linear region of the gain modulation circuit of the present disclosure is adjustable.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
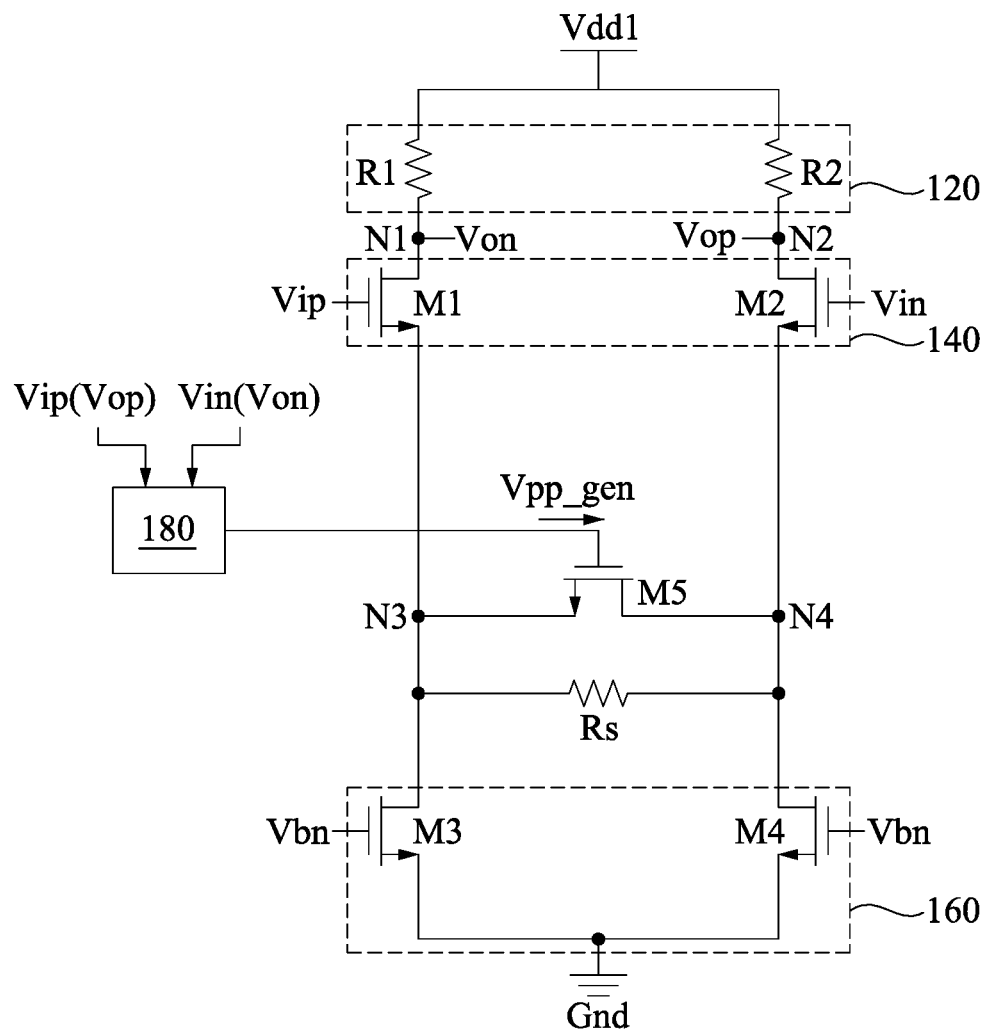
FIG. 1 is a circuit diagram illustrating a gain modulation circuit according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may refer to "electrically connected" or "electrically coupled." "Connected" or "coupled" may also refer to operations or actions between two or more elements.

Reference is made to FIG. 1. FIG. 1 is a circuit diagram illustrating a gain modulation circuit 100 according to some embodiments of the present disclosure. As illustrated in FIG. 1, the gain modulation circuit 100 is an amplifier circuit. A phase of an input voltage Vip is opposite to a phase of an input voltage Vin. A phase of an output voltage Vop is opposite to a phase of an output voltage Von. For example, the output voltage Vop may be +2 volt and the output voltage Von may be −2 volt if the input voltage Vip is +1 volt and the input voltage Vin is −1 volt. In other words, an absolute value of a difference between the output voltage Vop and the output voltage Von has a positive correlation to an absolute value of a difference between the input voltage Vip and the input voltage Vin. The gain modulation circuit 100 may be applied in a pipeline ADC, a pipeline SAR-ADC, a SerDes or other circuitry.

In some embodiments, the absolute value of the difference between the output voltage Vop and the output voltage Von is greater than the absolute value of the difference between the input voltage Vip and the input voltage Vin.

In some embodiments, the absolute value of the difference between the output voltage Vop and the output voltage Von is less than the absolute value of the difference between the input voltage Vip and the input voltage Vin.

Figure 2:
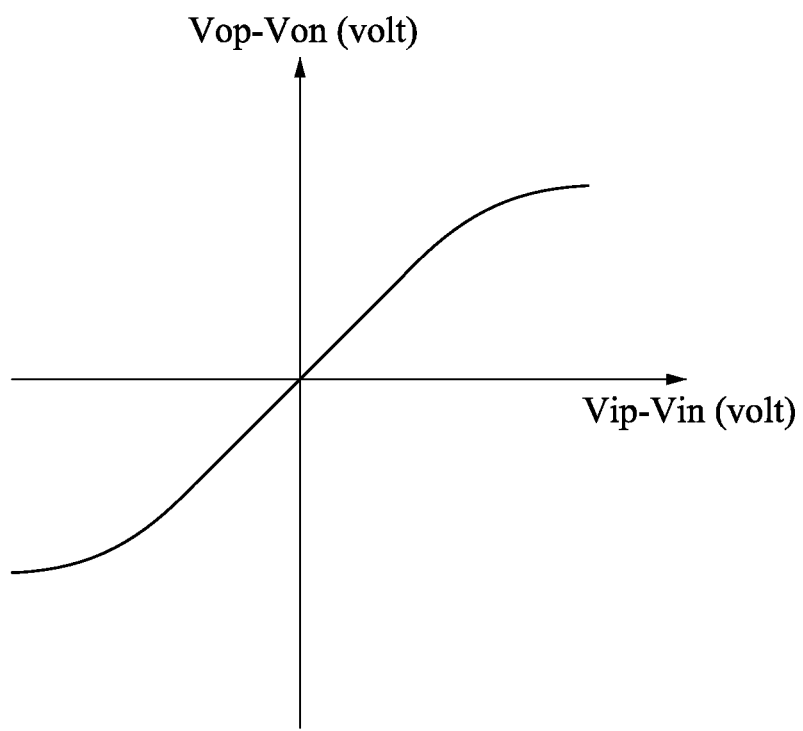
FIG. 2 is schematic diagram illustrating a relationship between a pair of output voltages and a pair of input voltages in some related technologies.

Reference is made to FIG. 2. FIG. 2 is schematic diagram illustrating a relationship between the pair of output voltages Vop and Von and the pair of input voltages Vip and Vin in some related technologies. As illustrated in FIG. 2, a gain of a gain modulation circuit in these related technologies becomes smaller (for example, a transconductance gm in a following equation (1) becomes smaller) when the absolute value of the difference between the input voltage Vip and the input voltage Vin is greater, such that a linearity of the gain modulation circuit becomes worse. Compared to these related technologies, a gain of the gain modulation circuit 100 in FIG. 1 is effectively maintained when the absolute value of the difference between the input voltage Vip and the input voltage Vin becomes greater. Thus, a linear region of the gain modulation circuit 100 becomes greater. The details are described in following paragraphs.

As illustrated in FIG. 1, the gain modulation circuit 100 includes a load circuit 120, a differential circuit 140, a current source 160, a detector circuit 180, a resistor Rs, and a transistor M5. The load circuit 120 is configured to receive a supply voltage Vdd1. The load circuit 120 includes a resistor R1 and a resistor R2. The differential circuit 140 is configured to receive the input voltage Vip and the input voltage Vin. The differential circuit 140 includes a transistor M1 and a transistor M2. The differential circuit 140 and the load circuit 120 are coupled at a node N1 and a node N2. The load circuit 120 and the differential circuit 140 generate the output voltage Von at the node N1 and the output voltage Vop at the node N2, according to the supply voltage Vdd1, the input voltage Vip, and the input voltage Vin. The current source 160 is coupled to the ground terminal Gnd and is configured to generate a constant current according to a bias voltage Vbn. The current source 160 includes a transistor M3 and a transistor M4. The resistor Rs, the differential circuit 140, and the current source 160 are coupled at a node N3 and a node N4. The transistor M5, the differential circuit 140, and the current source 160 are coupled at the node N3 and the node N4. In other words, the resistor Rs and the transistor M5 are coupled in parallel between the node N3 and the node N4.

In some embodiments, the detector circuit 180 is configured to receive the input voltage Vip and the input voltage Vin, and generate a detection signal Vpp_gen according to the input voltage Vip and the input voltage Vin. A voltage level of the detection signal Vpp_gen has a positive correlation to the absolute value of the difference between the input voltage Vip and the input voltage Vin. In other words, the voltage level of the detection signal Vpp_gen is higher when the absolute value of the difference between the input voltage Vip and the input voltage Vin is greater. The detection signal Vpp_gen is transmitted to a control terminal of the transistor M5, to control a turned-on degree of the transistor M5. For example, under a condition of that the transistor M5 is implemented by a N-MOSFET, the turned-on degree of the transistor M5 is greater when the voltage level of the detection signal Vpp_gen is higher. The voltage level of the detection signal Vpp_gen may be designed according to a type of the transistor M5.

As described above, the absolute value of the difference between the output voltage Vop and the output voltage Von has the positive correlation to the absolute value of the difference between the input voltage Vip and the input voltage Vin. Accordingly, in some other embodiments, the detector circuit 180 may receive the output voltage Vop and the output voltage Von. The detector circuit 180 generates the detection signal Vpp_gen according to the output voltage Vop and the output voltage Von. The voltage level of the detection signal Vpp_gen has a positive correlation to the absolute value of the difference between the output voltage Vop and the output voltage Von. In other words, the voltage level of the detection signal Vpp_gen is higher when the absolute value of the difference between the output voltage Vop and the output voltage Von is greater. The detection signal Vpp_gen is transmitted to the control terminal of the transistor M5, to control the turned-on degree of the transistor M5.

Based on a small-signal modeling, the gain of the gain modulation circuit 100 can be derived to the following equation (1):

$$G = gm \times rd / (1 + gm \times 0.5 \times rs) \qquad (1)$$

G is the gain of the gain modulation circuit 100, gm is a transconductance of the transistor M1 or the transistor M2, rd is a resistance value of the resistor R1 or the resistor R2, and rs is an equivalent resistance value of a resistor Rs coupled in parallel to the transistor M5.

Figure 3:
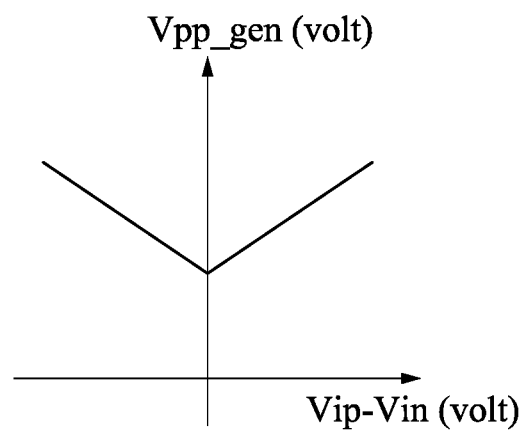
FIG. 3 is schematic diagram illustrating a relationship between a detection signal and a pair of input voltages according to some embodiments of the present disclosure.
Figure 4:
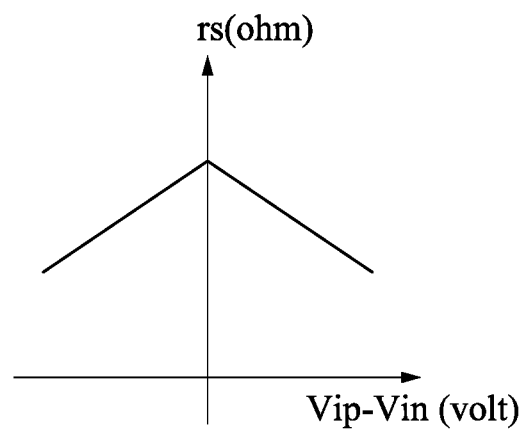
FIG. 4 is schematic diagram illustrating a relationship between an equivalent resistance value and a pair of input voltages according to some embodiments of the present disclosure.
Figure 5:
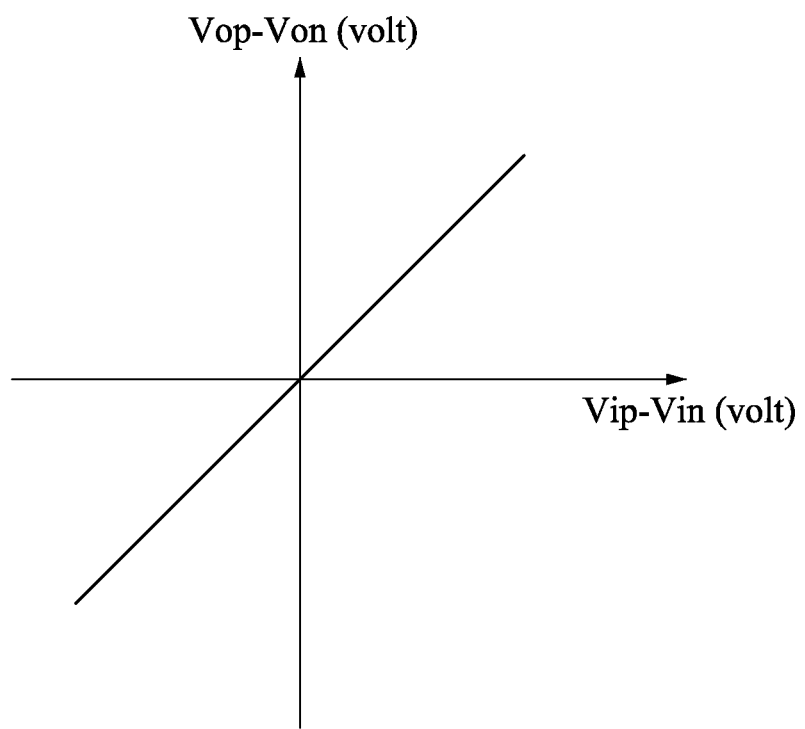
FIG. 5 is schematic diagram illustrating a relationship between a pair of output voltages and a pair of input voltages according to some embodiments of the present disclosure.

References are made to FIGS. 1, 3, 4, and 5. FIG. 3 is schematic diagram illustrating a relationship between the detection signal Vpp_gen and the pair of input voltages Vip and Vin according to some embodiments of the present disclosure. FIG. 4 is schematic diagram illustrating a relationship between the equivalent resistance value rs and the pair of input voltages Vip and Vin according to some embodiments of the present disclosure. FIG. 5 is schematic diagram illustrating a relationship between the pair of output voltages Vop and Von and the pair of input voltages Vip and Vin according to some embodiments of the present disclosure. As illustrated in FIG. 3 and as described above, the voltage level of the detection signal Vpp_gen is higher when the absolute value of the difference between the input voltage Vip and the input voltage Vin is greater. Accordingly, the turned-on degree of the transistor M5 of the gain modulation circuit 100 is greater. A resistance value of the transistor M5 is smaller when the turned-on degree of the transistor M5 is greater. Thus, the equivalent resistance value rs in the equation (1) is smaller, as shown in FIG. 4. As described above, in the related technologies, the transconductance gm may be smaller when the absolute value of the difference between the input voltage Vip and the input voltage Vin is greater, such that the gain G of the gain modulation circuit 100 becomes smaller and the linearity of the gain modulation circuit 100 becomes worse.

However, for the gain modulation circuit 100 in FIG. 1 and based on the equation (1) above, the transconductance gm becomes smaller and the equivalent resistance value rs also becomes smaller when the absolute value of the difference between the input voltage Vip and the input voltage Vin is greater. Accordingly, the gain G may be maintained. In other words, the decrease of the equivalent resistance value rs may be configured to compensate for the decrease of the transconductance gm. Thus, compared to FIG. 2, the linear region of the gain modulation circuit 100 becomes greater, as illustrated in FIG. 5.

In some other embodiments, the transistor M5 may be replaced by a variable resistor. The detection signal Vpp_ gen is configured to adjust a resistance value of the variable resistor. Other elements which can replace the transistor M5 are within the contemplated scope of the present disclosure.

Figure 6:
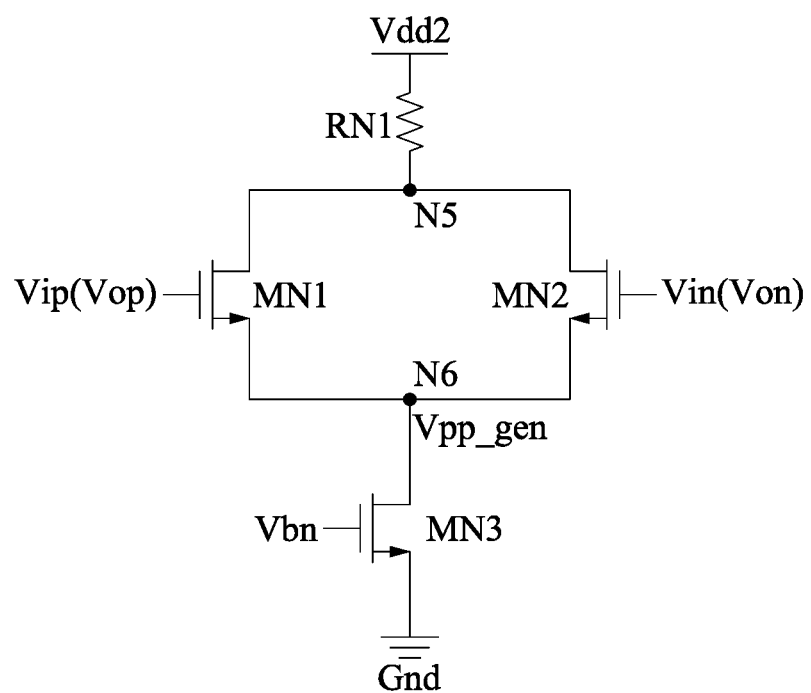
FIG. 6 is a circuit diagram illustrating a detector circuit according to some embodiments of the present disclosure.

Reference is made to FIG. 6. FIG. 6 is a circuit diagram illustrating a detector circuit 600 according to some embodiments of the present disclosure. In some embodiments, the detector circuit 600 may be configured to implement the detector circuit 180 in FIG. 1. As illustrated in FIG. 6, the detector circuit 600 includes a transistor MN1, a transistor MN2, and the transistor MN3. In some embodiments, the detector circuit 600 further includes a resistor RN1. The resistor RN1 is coupled to the transistor MN1 and the transistor MN2 at the node N5. The resistor RN1 is configured to prevent the transistor MN1 and the transistor MN2 from directly receiving a supply voltage Vdd2. In some embodiments, the supply voltage Vdd2 in the detector circuit 600 may be replaced by the supply voltage Vdd1 in FIG. 1. In some embodiments, the resistor RN1 may be replaced by a transistor. The transistor MN1 and the transistor MN2 are coupled to the transistor MN3 at the node N6. The transistor MN3 is coupled to the ground terminal Gnd and is configured to receive the bias voltage Vbn to be a current source. As described above, In some embodiments, a turned-on degree of the transistor MN1 and a turned-on degree of the transistor MN2 may be respectively controlled by the input voltage Vip and the input voltage Vin to generate the detection signal Vpp_gen, and the voltage level of the detection signal Vpp_gen has a positive correlation to the absolute value of the difference between the input voltage Vip and the input voltage Vin. In some other embodiments, the turned-on degree of the transistor MN1 and the turned-on degree of the transistor MN2 may be respectively controlled by the output voltage Vop and the output voltage Von to generate the detection signal Vpp_gen, and the voltage level of the detection signal Vpp_gen has a positive correlation to the absolute value of the difference between the output voltage Vop and the output voltage Von. The detection signal Vpp_gen is configured to control the turned-on degree of the transistor M5 in FIG. 1.

The implementations of the detector circuit 600 are given for illustrative purposes. Various implementations of the detector circuit 600 are within the contemplated scope of the present disclosure. For example, the detector circuit 600 may be designed to select a greater one of the input voltage Vip and the input voltage Vin to generate the detection signal Vpp_gen. In some embodiments, the detector circuit 600 is designed to select a greater one of the output voltage Vop and the output voltage Von to generate the detection signal Vpp_gen.

Figure 7:
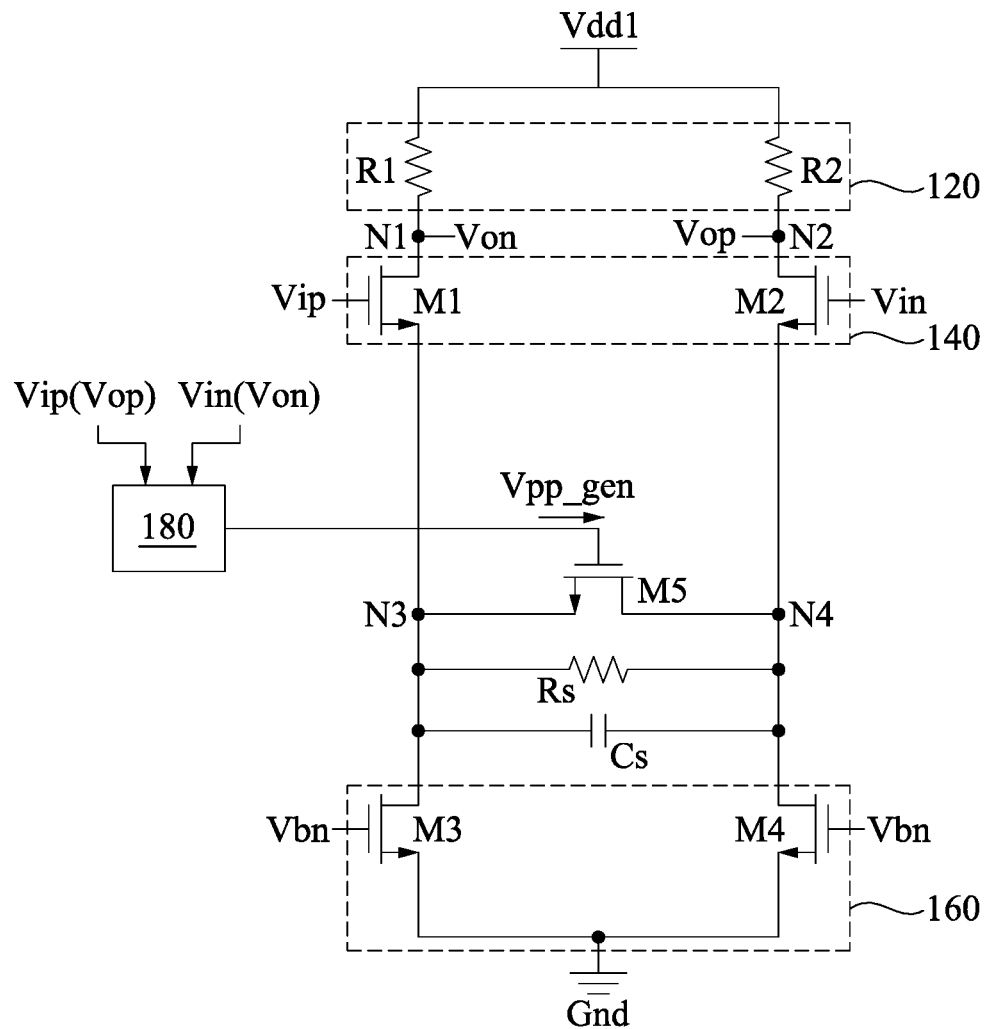
FIG. 7 is a circuit diagram illustrating a gain modulation circuit according to some embodiments of the present disclosure.

Reference is made to FIG. 7. FIG. 7 is a circuit diagram illustrating a gain modulation circuit 700 according to some embodiments of the present disclosure. As illustrated in FIG. 7, the gain modulation circuit 700 is an equalizer circuit. With respect to the embodiments in FIG. 1, like elements in FIG. 7 are designated with the same reference numbers for ease of understanding. A difference between the gain modulation circuit 700 in FIG. 7 and the gain modulation circuit 100 in FIG. 1 is that the gain modulation circuit 700 in FIG. 7 further includes a capacitor Cs. The capacitor Cs, the resistor Rs, and the transistor M5 are coupled in parallel between the node N3 and the node N4. The operations of how the gain modulation circuit 700 generates the detection signal Vpp_gen to maintain the gain of the gain modulation circuit 700 are similar to those corresponding to the gain modulation circuit 100 in FIG. 1, thus details of the operations are not described herein again.

Figure 8:
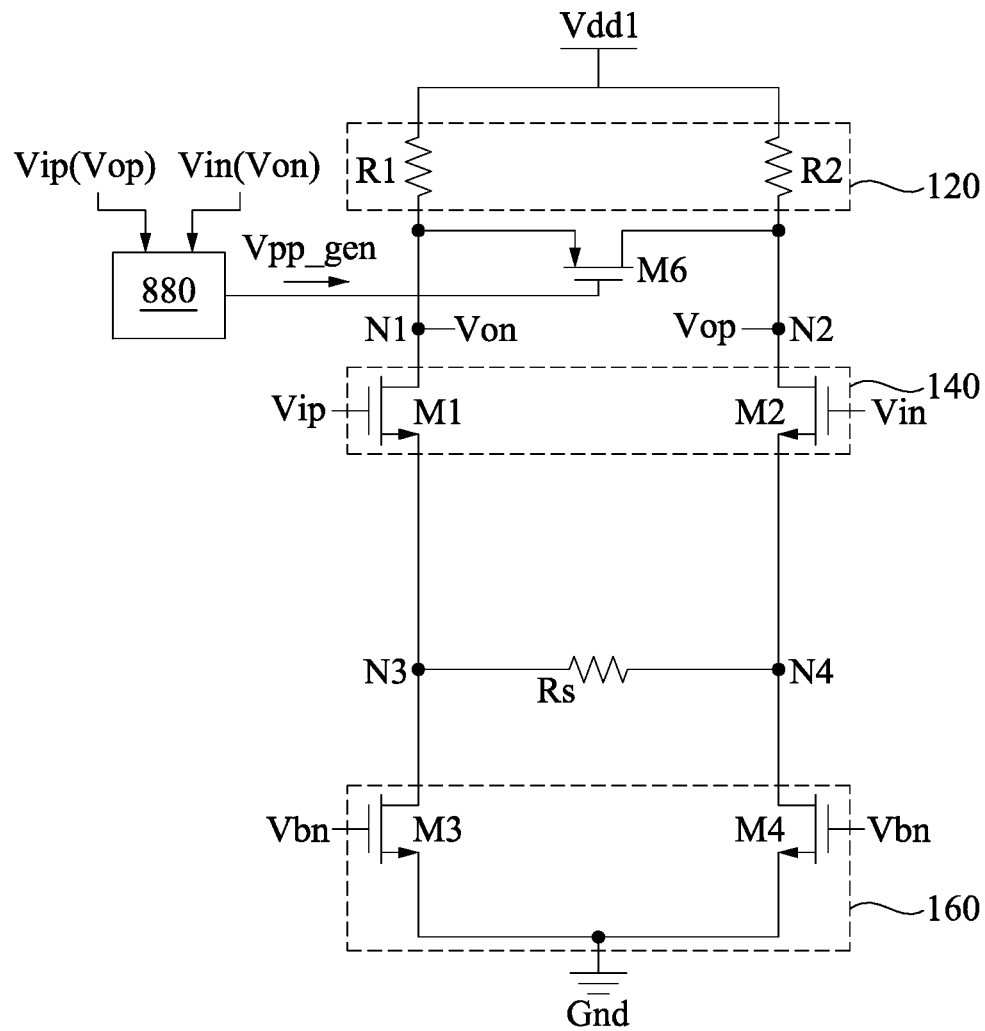
FIG. 8 is a circuit diagram illustrating a gain modulation circuit according to some embodiments of the present disclosure.

Reference is made to FIG. 8. FIG. 8 is a circuit diagram illustrating a gain modulation circuit 800 according to some embodiments of the present disclosure. As illustrated in FIG. 8, the gain modulation circuit 800 is an amplifier circuit. With respect to the embodiments of FIG. 1, like elements in FIG. 8 are designated with the same reference numbers for ease of understanding. A difference between the gain modulation circuit 800 in FIG. 8 and the gain modulation circuit 100 in FIG. 1 is that the gain modulation circuit 800 further includes a transistor M6 and excludes the transistor M5. In some embodiments, the transistor M6 is implemented by a P-MOSFET. The transistor M6, the differential circuit 140, and the load circuit 120 are coupled at the node N1 and the node N2. With the configuration of the transistor M6, the equivalent resistance value rd in the equation (1) above is a resistance value of a half of a resistor corresponding to the transistor M6 coupled in parallel to the resistor R1 (or the resistor R2). As described above, the voltage level of the detection signal Vpp_gen is higher when the absolute value of the difference between the input voltage Vip and the input voltage Vin is greater. Accordingly, the turned-on degree of the transistor M6 is smaller. Thus, the resistance value of the transistor M6 is higher, such that the equivalent resistance value rd is higher. As described above, the transconductance gm is smaller, but the equivalent resistance value rd is greater when the absolute value of the difference between the input voltage Vip and the input voltage Vin is greater. Accordingly, the gain G of gain modulation circuit 800 may be maintained. In other words, the increase of the equivalent resistance value rd is configured to compensate for the decrease of the transconductance gm. Thus, a linear-region of the gain modulation circuit 800 becomes larger. The voltage level of the detection signal Vpp_gen may be designed in accordance with a type of the transistor M6.

Figure 9:
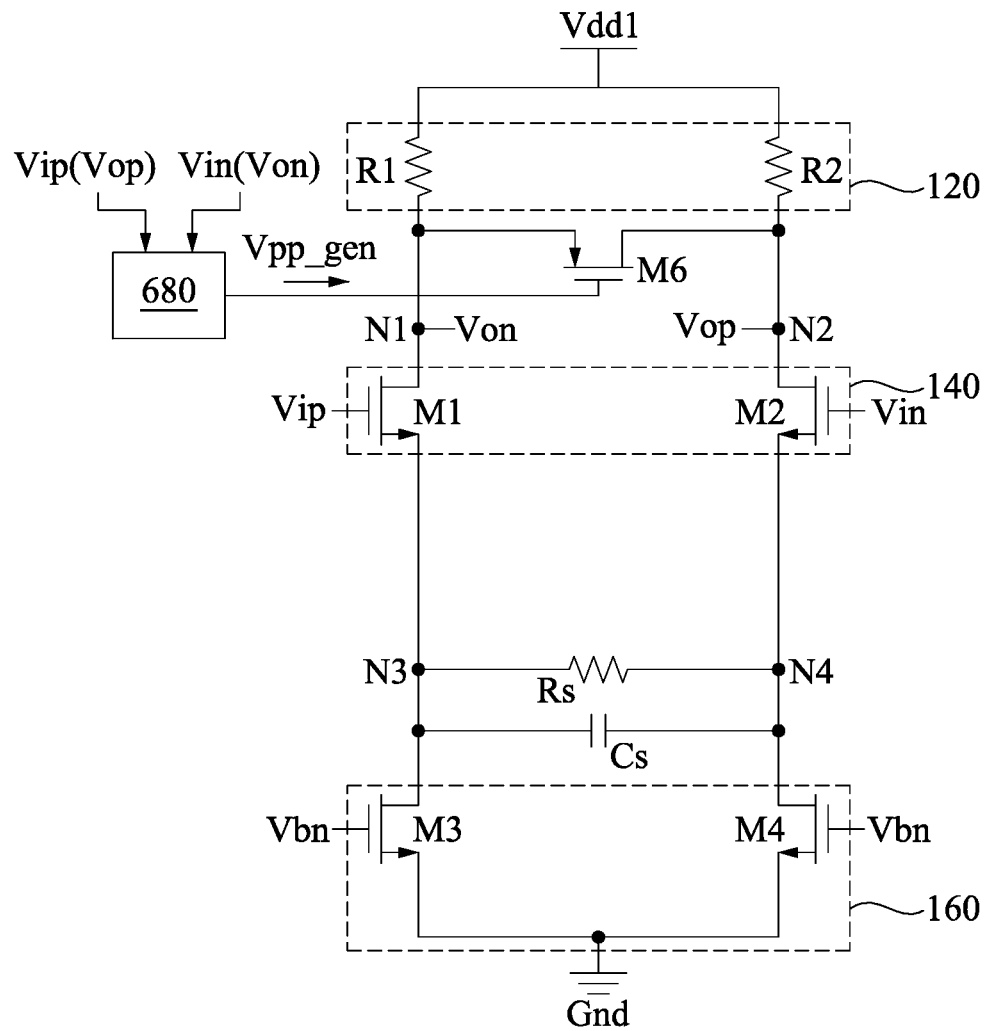
FIG. 9 is a circuit diagram illustrating a gain modulation circuit according to some embodiments of the present disclosure.

Reference is made to FIG. 9. FIG. 9 is a circuit diagram illustrating a gain modulation circuit 900 according to some embodiments of the present disclosure. As illustrated in FIG. 9, the gain modulation circuit 900 is an equalizer circuit. With respect to the embodiments in FIG. 7, like elements in FIG. 9 are designated with the same reference numbers for ease of understanding. A difference between the gain modulation circuit 900 in FIG. 9 and the gain modulation circuit 700 in FIG. 7 is that the gain modulation circuit 900 in FIG. 9 further includes the transistor M6 and excludes the transistor M5. The operations of the transistor M6 are described in the above paragraphs corresponding to FIG. 8, so details are not described herein again.

It is noted that the implementations of the transistors M1-M6 and the transistors MN1-MN3 are given for illustrative purposes. Various implementations of the transistors M1-M6 and transistors MN1-MN3 are within the contemplated scope of the present disclosure. For example, the transistors M1-M5 and transistors MN1-MN3 may be implemented by P-MOSFETs. The control signals corresponding to the transistors M1-M5 and transistors MN1-MN3 are designed accordingly.

As shown in the above embodiments, the linear region of the gain modulation circuit of the present disclosure is adjustable.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A gain modulation circuit, comprising:
a load circuit configured to receive a supply voltage;
a differential circuit coupled to the load circuit, wherein the differential circuit and the load circuit are configured to generate a pair of output voltages according to a pair of input voltages and the supply voltage;
a current source coupled to the differential circuit;
a resistor coupled to the differential circuit and the current source;
a first transistor coupled to the differential circuit; and
a detector circuit configured to receive the pair of input voltages or the pair of output voltages and generate a detection signal according to the pair of input voltages received by the detector circuit or according to the pair of output voltages received by the detector circuit, wherein a turned-on degree of the first transistor is adjusted based on the detection signal, to adjust a linear region of the gain modulation circuit.

2. The gain modulation circuit of claim 1, wherein the pair of input voltages comprise a first input voltage and a second input voltage, wherein a voltage level of the detection signal is higher when an absolute value of a difference between the first input voltage and the second input voltage is greater.

3. The gain modulation circuit of claim 2, wherein the detector circuit comprises a second transistor and a third transistor, wherein the first input voltage and the second input voltage are respectively configured to control a turned-on degree of the second transistor and a turned-on degree of the third transistor, to generate the detection signal.

4. The gain modulation circuit of claim 2, wherein the detector circuit selects a greater one of the first input voltage and the second input voltage to generate the detection signal.

5. The gain modulation circuit of claim 1, wherein the pair of input voltages comprise a first input voltage and a second input voltage, and the pair of output voltages comprise a first output voltage and a second output voltage, wherein an absolute value of a difference between the first output voltage and the second output voltage is greater when an absolute value of a difference between the first input voltage and the second input voltage is greater.

6. The gain modulation circuit of claim 5, wherein detector circuit is configured to receive the pair of output voltages to output the detection signal according to the pair of output voltages.

7. The gain modulation circuit of claim 6, wherein the detector circuit comprises a second transistor and a third transistor, wherein the first output voltage and the second output voltage are respectively configured to control a turned-on degree of the second transistor and a turned-on degree of the third transistor, to generate the detection signal.

8. The gain modulation circuit of claim 6, wherein the detector circuit selects a greater one of the first output voltage and the second output voltage to generate the detection signal.

9. The gain modulation circuit of claim 1, wherein the differential circuit and the current source are coupled at a first node and a second node, wherein the resistor and the first transistor are coupled in parallel at the first node and the second node.

10. The gain modulation circuit of claim 9, wherein the gain modulation circuit is an amplifier circuit.

11. The gain modulation circuit of claim 9, wherein the gain modulation circuit is an equalizer circuit and the equalizer circuit further comprises:
a capacitor coupled in parallel with the resistor and the first transistor at the first node and the second node.

12. The gain modulation circuit of claim 1, wherein the differential circuit and the load circuit are coupled at a first node and a second node, wherein the first transistor is coupled at the first node and the second node.

13. A gain modulation circuit, comprising:
a load circuit configured to receive a supply voltage;
a differential circuit coupled to the load circuit, wherein the differential circuit and the load circuit are configured to generate a pair of output voltages according to a pair of input voltages and the supply voltage;
a current source coupled to the differential circuit;
a resistor coupled to the differential circuit and the current source; and
a detector circuit configured to receive the pair of input voltages or the pair of output voltages and generate a detection signal according to the pair of input voltages received by the detector circuit or according to the pair of output voltages received by the detector circuit, wherein the detection signal is configured to control a gain of the gain modulation circuit, to adjust a linear region of the gain modulation circuit.

14. The gain modulation circuit of claim 13, wherein the pair of input voltages comprise a first input voltage and a second input voltage, and the pair of output voltages comprise a first output voltage and a second output voltage, wherein an absolute value of a difference between the first output voltage and a second output voltage is greater when an absolute value of a difference between the first input voltage and a second input voltage is greater, wherein the detector circuit is configured to receive the pair of output voltages to output the detection signal according to the pair of output voltages.

15. The gain modulation circuit of claim 14, wherein the detector circuit selects a greater one of the first input voltage and the second input voltage to generate the detection signal.

16. The gain modulation circuit of claim 13, wherein the differential circuit is coupled to a transistor and the detection signal is configured to control a turned-on degree of the transistor, to control the gain.

17. The gain modulation circuit of claim 16, wherein the differential circuit and the current source are coupled at a first node and a second node, wherein the resistor and the transistor are coupled in parallel at the first node and the second node.

18. The gain modulation circuit of claim 17, wherein the gain modulation circuit is an amplifier circuit.

19. The gain modulation circuit of claim 17, wherein the gain modulation circuit is an equalizer circuit and the equalizer circuit further comprises:
a capacitor coupled in parallel with the resistor and the transistor at the first node and the second node.

20. The gain modulation circuit of claim 16, wherein the differential circuit and the load circuit are coupled at a first node and a second node, wherein the transistor is coupled at the first node and the second node.

* * * * *